United States Patent
Hsu et al.

(10) Patent No.: US 9,530,540 B1
(45) Date of Patent: Dec. 27, 2016

(54) SATA CABLE

(71) Applicant: COMPONENT USER INDUSTRY CO., LTD., Taoyuan (TW)

(72) Inventors: Kuo Chen Hsu, Taoyuan (TW); Chi Sen Chang, Taoyuan (TW); Tzu Han Wu, Taoyuan (TW)

(73) Assignee: COMPONENT USER INDUSTRY CO., LTD. (TW)

( * ) Notice: Subject to any disclaimer, the term of this patent is extended or adjusted under 35 U.S.C. 154(b) by 0 days.

(21) Appl. No.: 14/798,829

(22) Filed: Jul. 14, 2015

(51) Int. Cl.
*H01B 7/08* (2006.01)

(52) U.S. Cl.
CPC .................... *H01B 7/0861* (2013.01)

(58) Field of Classification Search
CPC .................. H01B 7/08; H01B 11/04
USPC ......................... 174/117 F, 113 R
See application file for complete search history.

(56) References Cited

U.S. PATENT DOCUMENTS

| | | | | |
|---|---|---|---|---|
| 5,250,127 A | * | 10/1993 | Hara | H01B 7/385 |
| | | | | 156/247 |
| 5,658,164 A | * | 8/1997 | Parker | H01R 23/662 |
| | | | | 439/495 |
| 7,285,021 B2 | * | 10/2007 | Bell | G06F 1/1632 |
| | | | | 439/505 |
| 7,667,138 B2 | * | 2/2010 | Koga | H01B 7/0861 |
| | | | | 174/110 R |
| 8,669,483 B2 | * | 3/2014 | Shimura | H01B 7/0838 |
| | | | | 174/110 R |
| 2011/0244716 A1 | * | 10/2011 | Kruckenberg | H01B 11/00 |
| | | | | 439/502 |

\* cited by examiner

*Primary Examiner* — Chau N Nguyen
(74) *Attorney, Agent, or Firm* — Schmeiser, Olsen & Watts, LLP

(57) ABSTRACT

A SATA cable capable of grounding noise, includes a cable body; a lead group embedded in the cable body, having two ends exposed from two ends of the cable body, respectively, and comprising a signal transmitting lead group, a signal receiving lead group, power leads and ground leads, the signal transmitting lead group further comprising a first signal transmitting lead and a second signal transmitting lead, and the signal receiving lead group further comprising a first signal receiving lead and a second signal receiving lead; a first metal shield layer unit disposed on a surface of the cable body; a second metal shield layer unit disposed on another surface of the cable body; and a noise lead embedded in the cable body, electrically connected to ground leads, and having two ends exposed from the cable body to thereby electrically connect with the first metal shield layer unit.

6 Claims, 14 Drawing Sheets

SATA CABLE

FIELD OF TECHNOLOGY

The present invention relates to SATA cables and, more particularly, to a SATA cable capable of grounding noise to thereby prevent the noise from interfering with any external electronic component.

BACKGROUND

With information technology developing by leaps and bounds nowadays, there is an increasingly great demand for the enhancement of the efficiency of electronic data processing. To this end, SATA hard drives were introduced. A SATA hard drive requires a SATA cable for connection with an external electronic device. However, a conventional SATA cable fails to prevent noise exposure which interferes with an external electronic component, especially when the SATA cable is exposed. Accordingly, it is important to invent a SATA cable which is capable of ground noise to thereby prevent noise from interfering with any external electronic component.

SUMMARY

In view of the aforesaid drawbacks of the prior art, the inventor of the present invention conceived room for improvement in the prior art and thus conducted extensive researches and experiments according to the inventor's years of experience in the related industry, and finally developed a SATA cable as disclosed in the present invention to ground noise and thereby prevent noise from interfering with any external electronic component.

In order to achieve the above and other objectives, the present invention provides a SATA cable, comprising: a cable body; a lead group embedded in the cable body, having two ends exposed from two ends of the cable body, respectively, and comprising a signal transmitting lead group, a signal receiving lead group, a plurality of power leads and a plurality of ground leads, the signal transmitting lead group further comprising a first signal transmitting lead and a second signal transmitting lead, and the signal receiving lead group further comprising a first signal receiving lead and a second signal receiving lead; a first metal shield layer unit disposed on a surface of the cable body; a second metal shield layer unit disposed on another surface of the cable body; and at least a noise lead embedded in the cable body, electrically connected to at least one of the ground leads, and having two ends exposed from the cable body to thereby electrically connect with the first metal shield layer unit.

The SATA cable is characterized in that the at least a noise lead is disposed between the signal transmitting lead group and the signal receiving lead group.

The SATA cable is characterized in that the two ends of the at least a noise lead each have a noise lead bend segment, wherein the first metal shield layer unit comprises a first double sided adhesive layer, a first aluminum foil layer, two third double sided adhesive layers and two third aluminum foil layers, with the first aluminum foil layer having two ends each having a first aluminum foil layer bend segment, with the first double sided adhesive layer adhered to a surface of the cable body, with the first aluminum foil layer adhered to the first double sided adhesive layer, with the third double sided adhesive layers adhered to two sides of the first aluminum foil layer, respectively, with the first aluminum foil layer bend segments adhered to the third double sided adhesive layers, respectively, with the noise lead bend segments electrically connected to the first aluminum foil layer bend segments, respectively, with the third aluminum foil layers adhered to the first aluminum foil layer bend segments and covering the noise lead bend segments, respectively.

The SATA cable is characterized in that the second metal shield layer unit has a second double sided adhesive layer and a second aluminum foil layer, wherein the second double sided adhesive layer is adhered to another surface of the cable body, and the second aluminum foil layer is adhered to the second double sided adhesive layer.

The SATA cable is characterized in that the second metal shield layer unit has a second double sided adhesive layer and a second aluminum foil layer, wherein the second double sided adhesive layer is adhered to another surface of the cable body, and the second aluminum foil layer is adhered to the second double sided adhesive layer. The second double sided adhesive layer is of a larger thickness than the first double sided adhesive layer.

The SATA cable is characterized in that one end of the cable body is T-shaped, another end of the cable body is cruciform, or the two ends of the cable body are T-shaped and cruciform, respectively.

The SATA cable further comprises a T-shaped reinforced plate, a cruciform handheld plate or both, with the T-shaped reinforced plate connected to the T-shaped end of the cable body, and with the cruciform handheld plate connected to the cruciform end of the cable body.

Hence, the SATA cable of the present invention is capable of grounding noise to thereby prevent noise from interfering with any external electronic component.

BRIEF DESCRIPTION

Objectives, features, and advantages of the present invention are hereunder illustrated with specific embodiments in conjunction with the accompanying drawings, in which.

DETAILED DESCRIPTION

Figure 1:
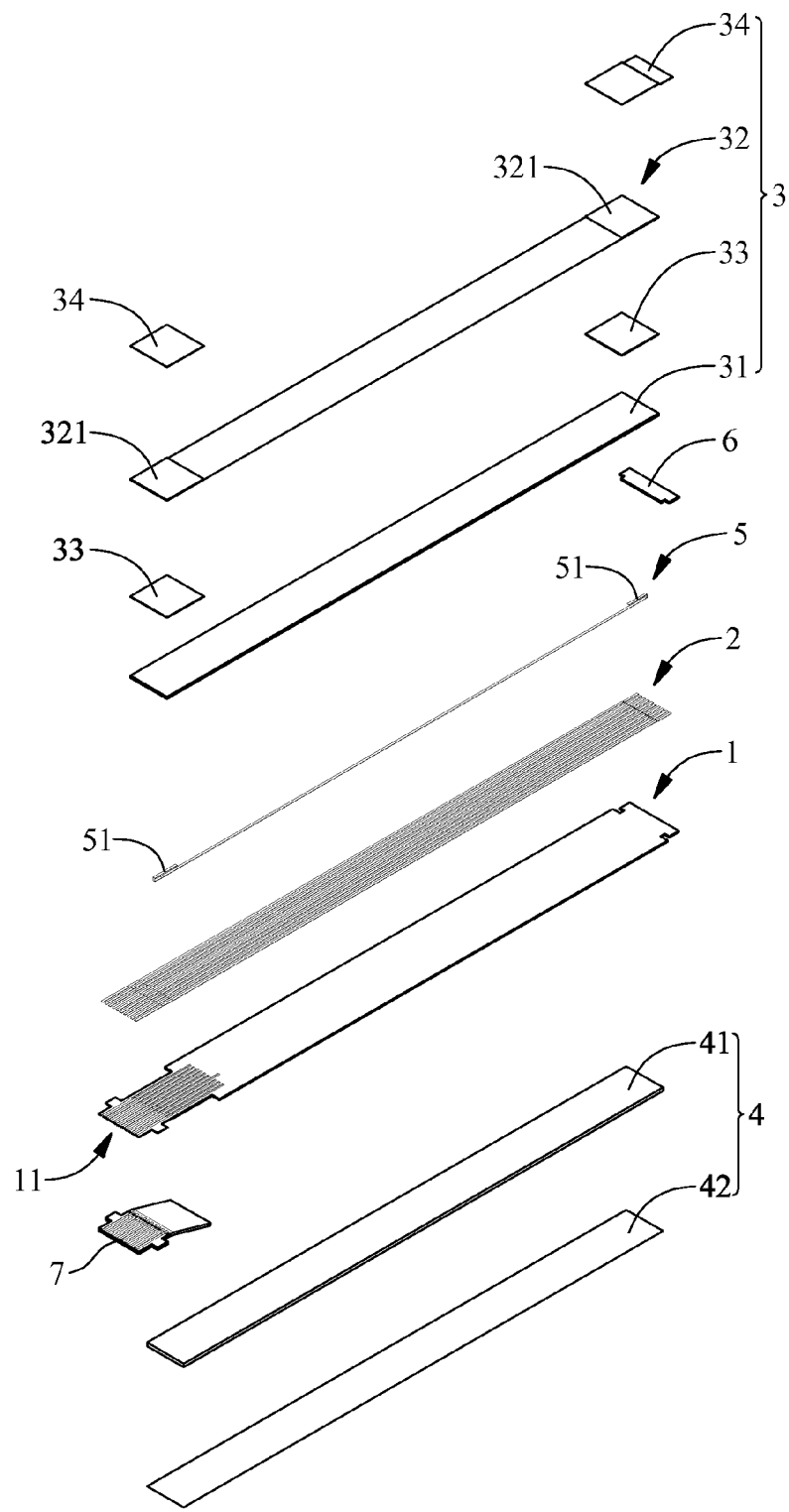
FIG. 1 is an exploded view of a SATA cable according to a preferred embodiment of the present invention.
Figure 2:
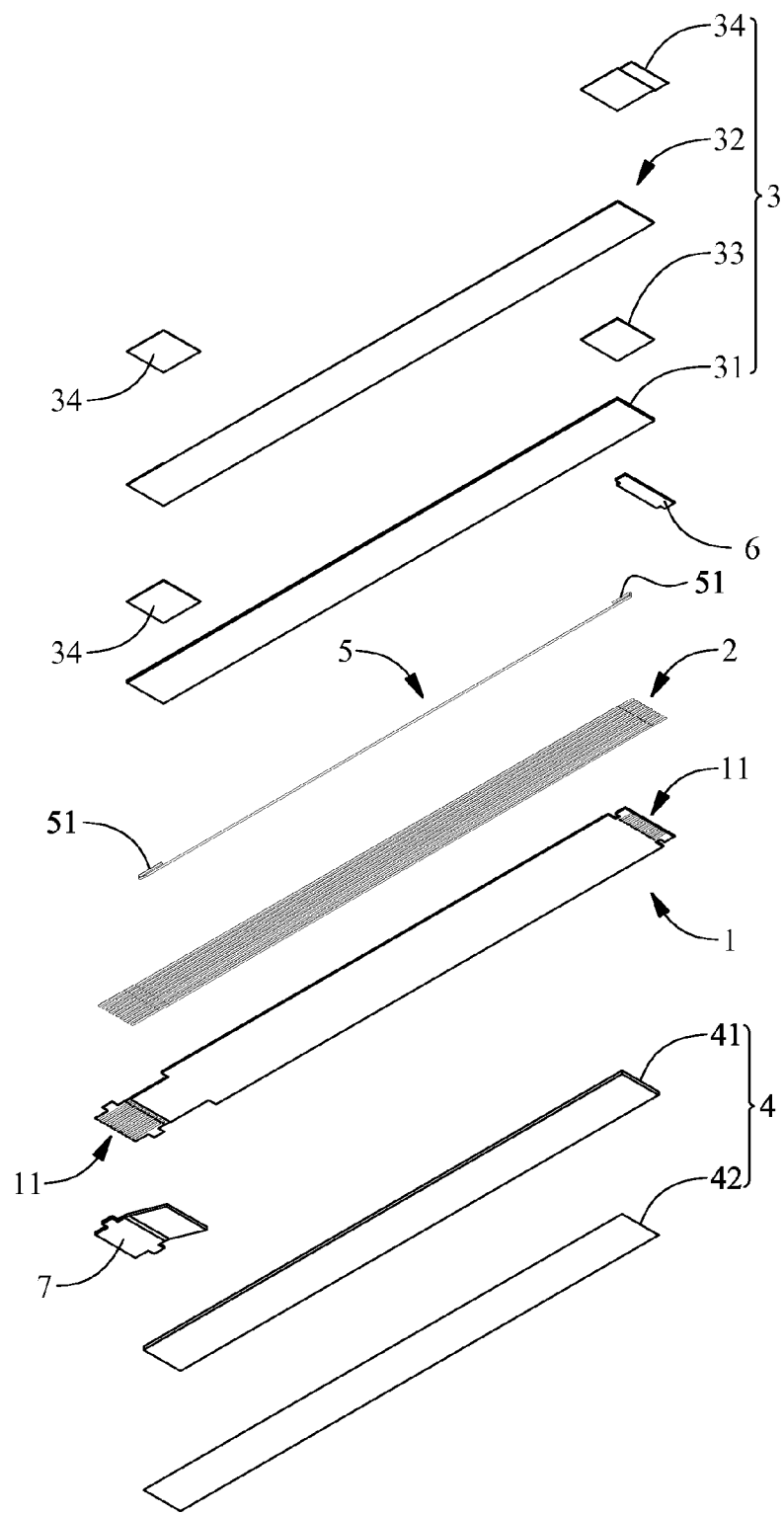
FIG. 2 is an exploded view of the SATA cable taken at another angle.
Figure 3:
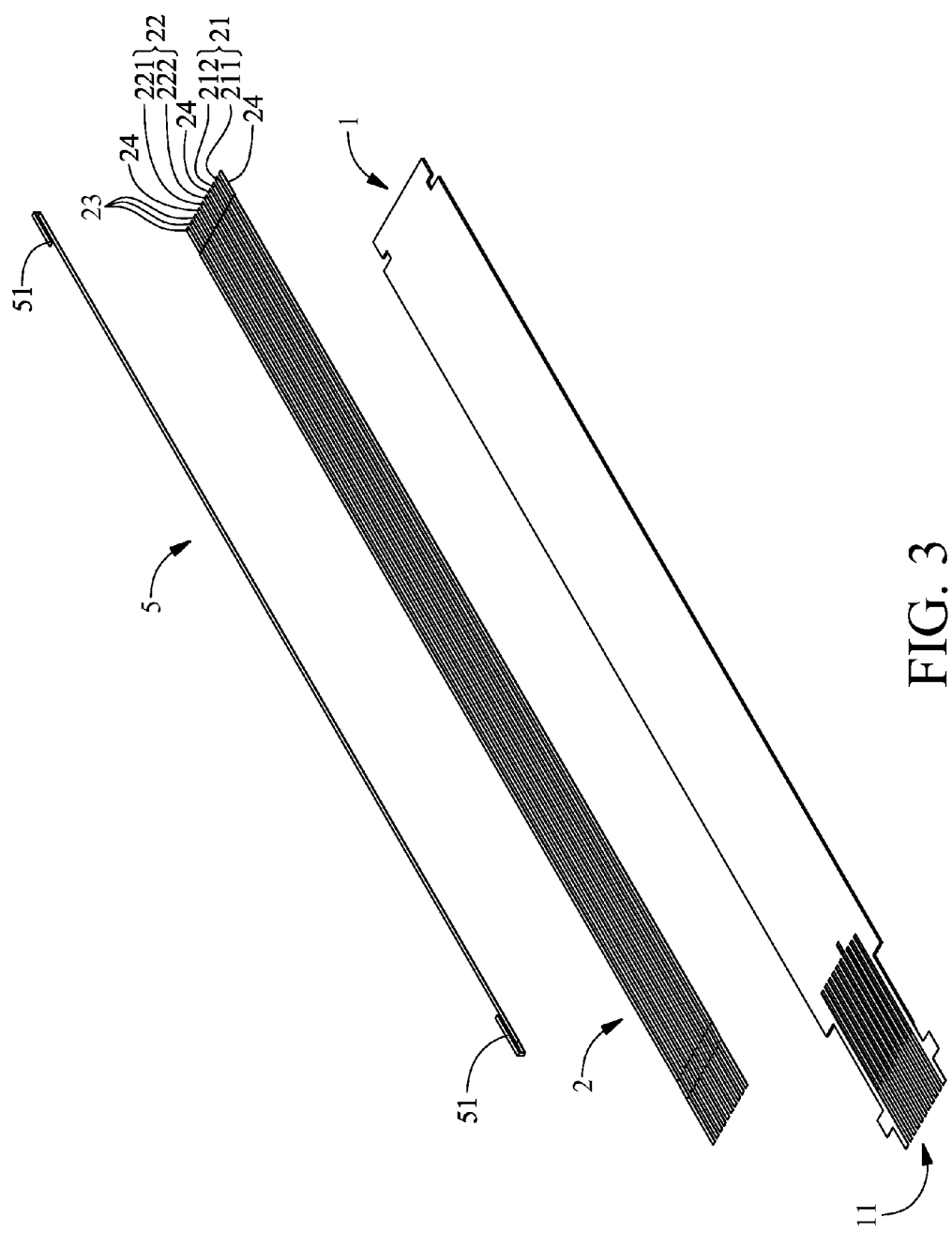
FIG. 3 is an exploded view of a cable body, lead group and noise lead according to the preferred embodiment of the present invention.
Figure 4:
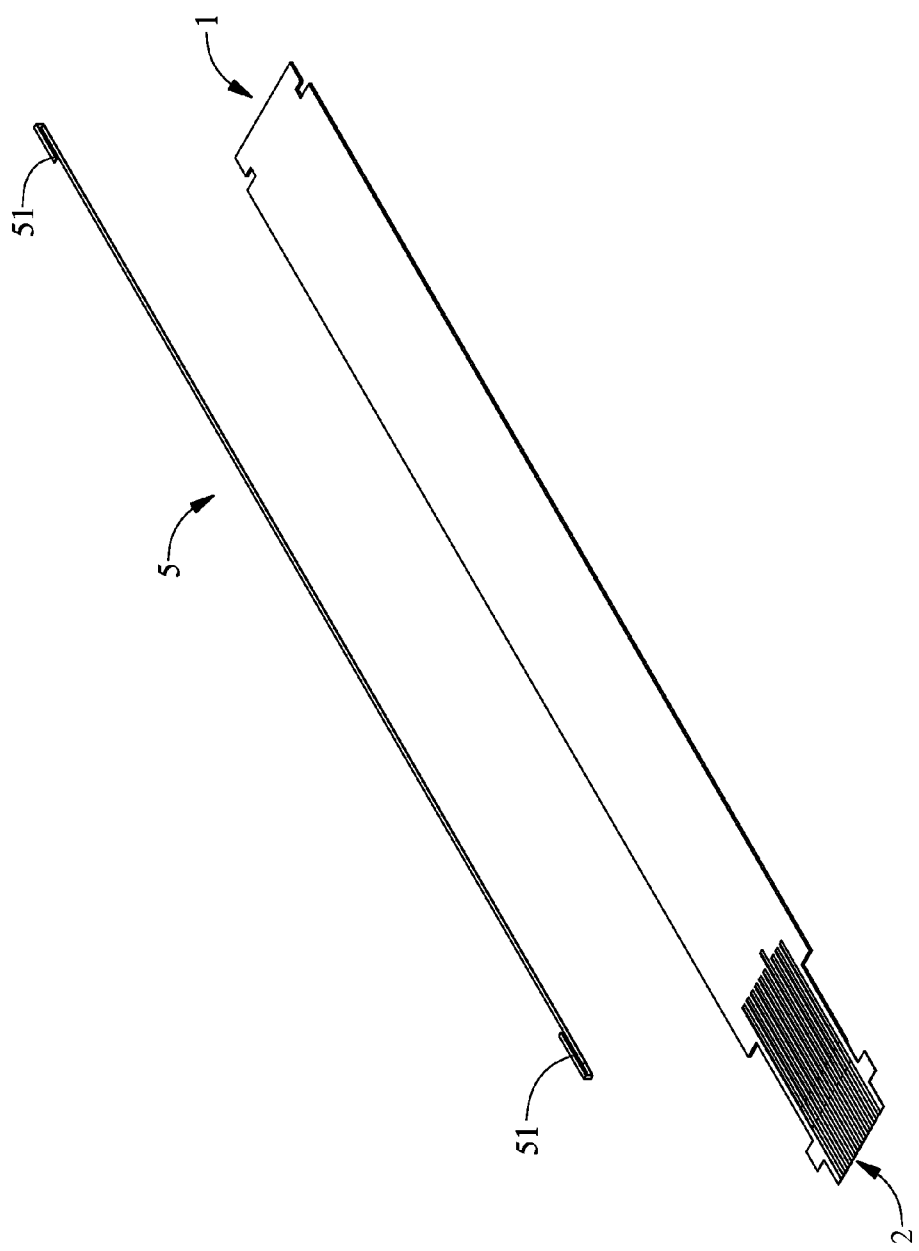
FIG. 4 is a schematic view of the lead group embedded in the cable body according to the preferred embodiment of the present invention.
Figure 5:
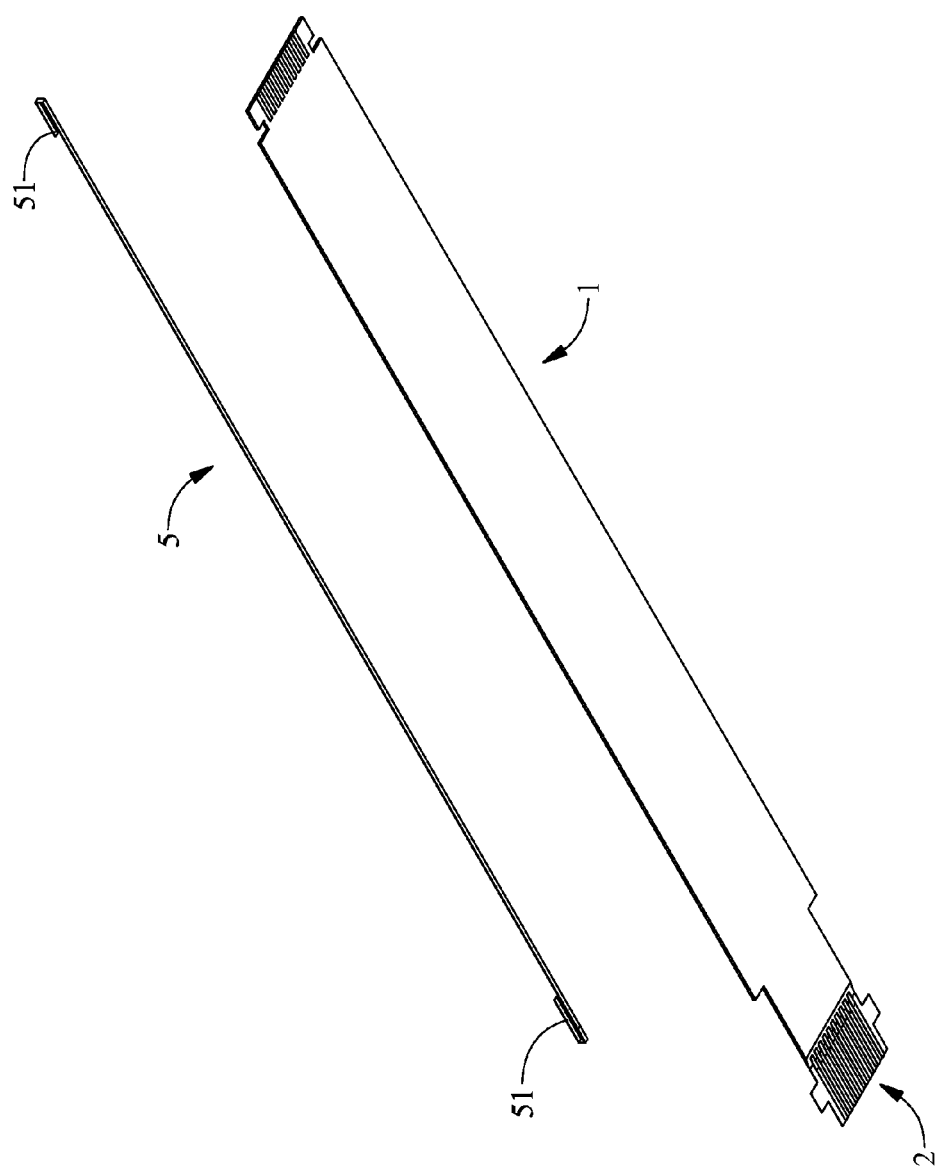
FIG. 5 is a schematic view of the lead group embedded in the cable body taken at another angle.
Figure 6:
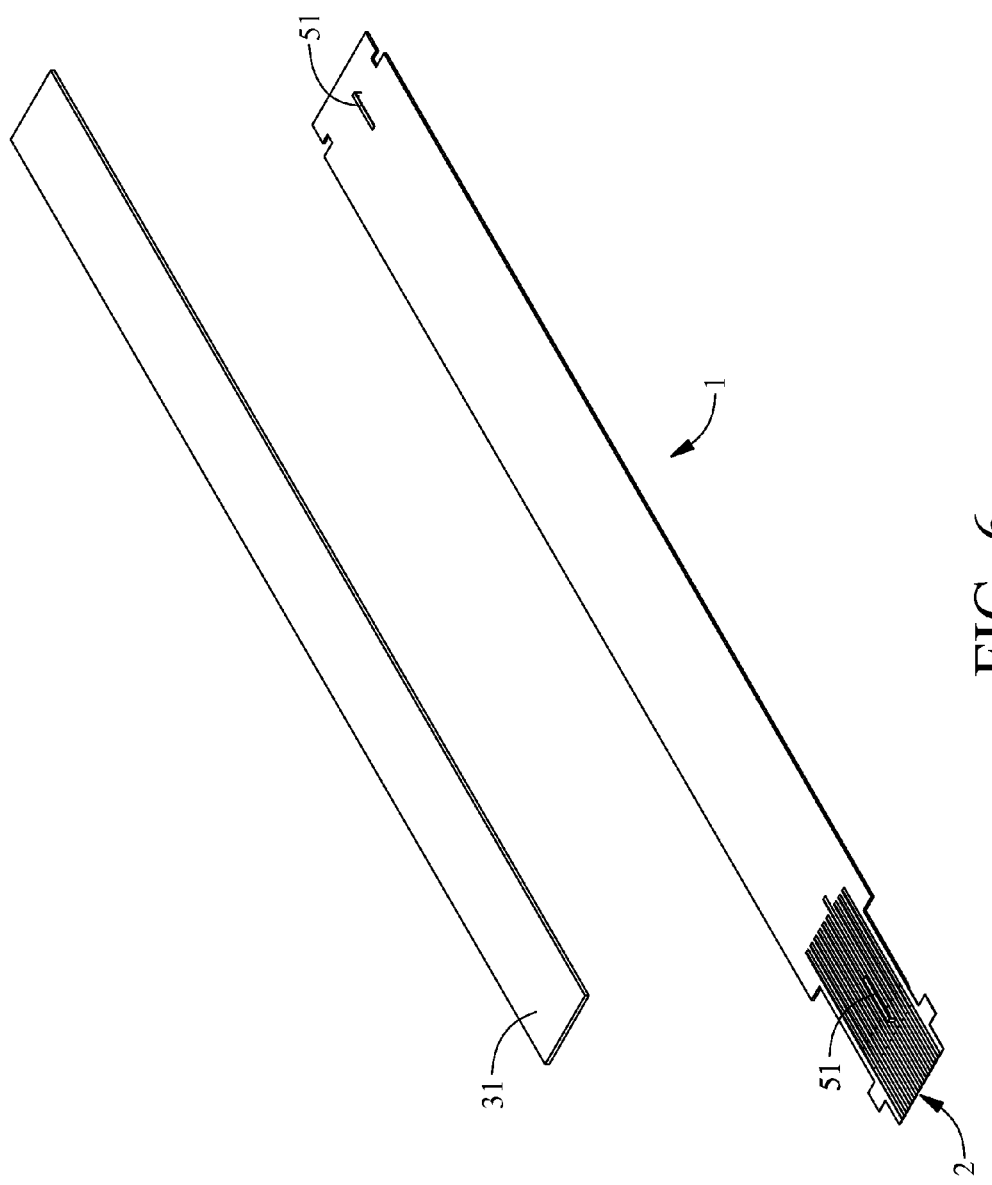
FIG. 6 is a schematic view of noise lead embedded in the cable body and a first double sided adhesive layer according to the preferred embodiment of the present invention.

Referring to FIG. 1 and FIG. 2, the present invention provides a SATA cable which comprises a cable body 1, a lead group 2, a first metal shield layer unit 3, a second metal shield layer unit 4 and at least a noise lead 5. The cable body 1 is provided in the form of a slender insulating strap. The two ends of the cable body 1 each have a plurality of slots 11 whereby the two ends of the lead group 2 are exposed from the two ends of the cable body 1, respectively, and thus electrically connected to an external electronic component or an electronic device. Referring to FIG. 1 and FIG. 2, the slots 11 disposed at the right end of the cable body 1 open downward, and the slots 11 disposed at the left end of the cable body 1 open both upward and downward, though the aforesaid configuration of the slots 11 is subject to changes as needed. Referring to FIG. 3 through FIG. 5, the lead group 2 is embedded in the cable body 1, and the two ends of the lead group 2 are exposed from the two ends of the cable body 1 through the slots 11, respectively. The lead group 2 comprises a signal transmitting lead group 21, a signal receiving lead group 22, a plurality of power leads 23 and a plurality of ground leads 24. The signal transmitting lead group 21 comprises a first signal transmitting lead 211 and a second signal transmitting lead 212. The signal receiving lead group 22 comprises a first signal receiving lead 221 and a second signal receiving lead 222. Referring to FIG. 3, the lead group 2 comprises the ground leads 24, the first signal transmitting lead 211, the second signal transmitting lead 212, the ground leads 24, the second signal receiving lead 222, the first signal receiving lead 221, the ground leads 24 and three power leads 23, which are arranged from right to left, though the aforesaid arrangement and quantity is subject to changes as needed. Referring to FIG. 1 and FIG. 2, the first metal shield layer unit 3 is disposed on the top surface of the cable body 1, and the second metal shield layer unit 4 is disposed on the bottom surface of the cable body 1. Referring to FIG. 6 through FIG. 10, the at least a noise lead 5 is embedded in the cable body 1 and electrically connected to the ground leads 24, whereas the two ends of the at least a noise lead 5 are exposed from the cable body 1 and thus electrically connected to the first metal shield layer unit 3. Referring to FIG. 3 and FIG. 6, the at least a noise lead 5 is in contact with the fourth one of the ground leads 24 to the right. However, it is also practicable for the at least a noise lead 5 to be in contact with the first one of the ground leads 24 to the right or the seventh one of the ground leads 24 to the right as needed. In addition, it is also practicable that the at least a noise lead 5 is provided in the plural and thus are in contact with the ground leads 24, respectively.

As mentioned before, the SATA cable of the present invention is characterized in that the at least a noise lead 5 is electrically connected to the ground leads 24 and the first metal shield layer unit 3 to thereby ground noise, so as to prevent the noise from interfering with any external electronic component. One of the two ends of the SATA cable of the present invention bends as needed.

Referring to FIG. 3 and FIG. 6, the SATA cable is characterized in that the at least a noise lead 5 is disposed between the signal transmitting lead group 21 and the signal receiving lead group 22 such that the at least a noise lead 5 is in contact with the fourth one of the ground leads 24 to the right. Hence, the at least a noise lead 5 is disposed in the midst of the cable body 1 to thereby reinforce the SATA cable of the present invention.

Figure 7:
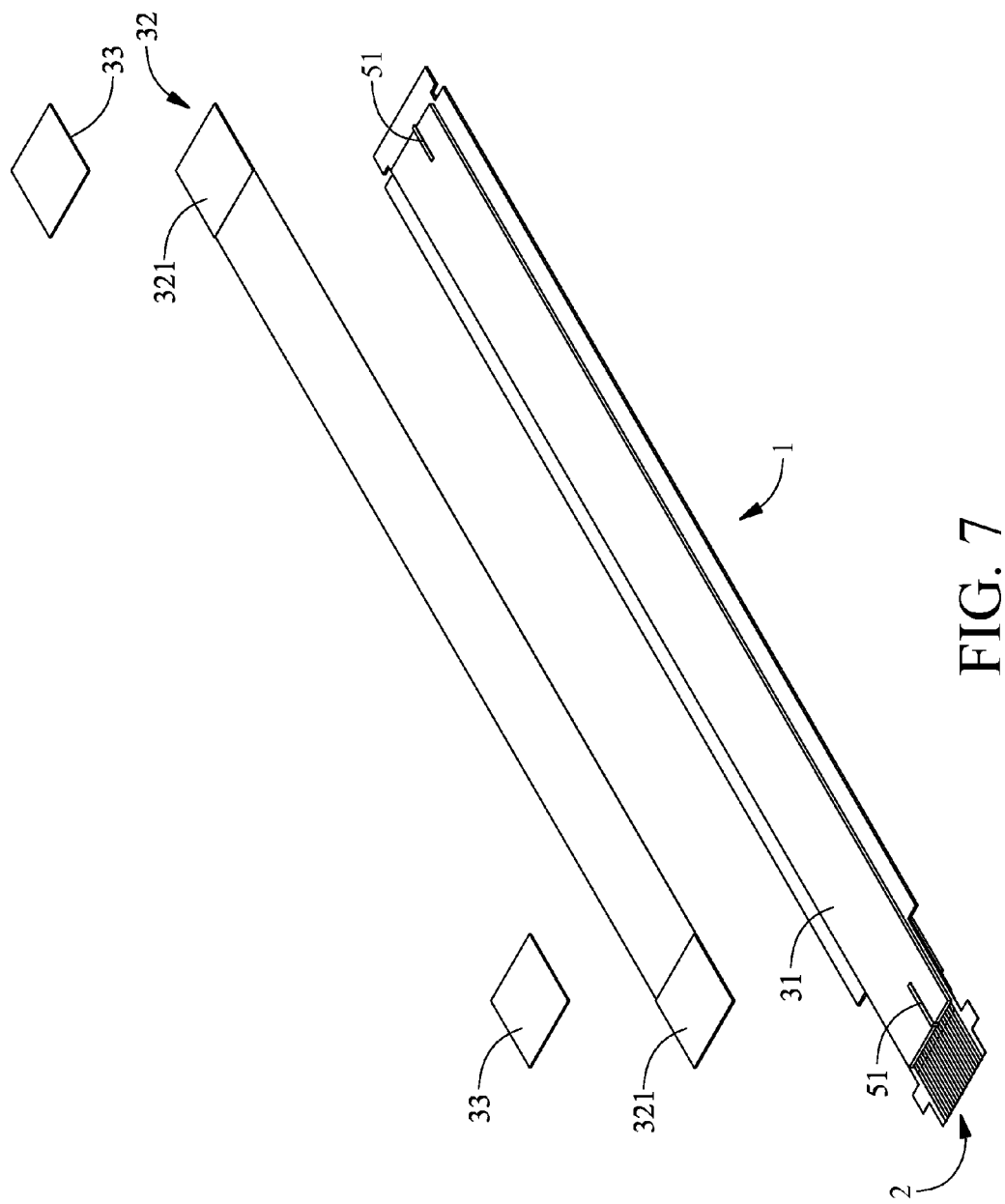
FIG. 7 is a schematic view of the first double sided adhesive layer adhered to the cable body and a first aluminum foil layer and third double sided adhesive layers according to the preferred embodiment of the present invention.
Figure 8:
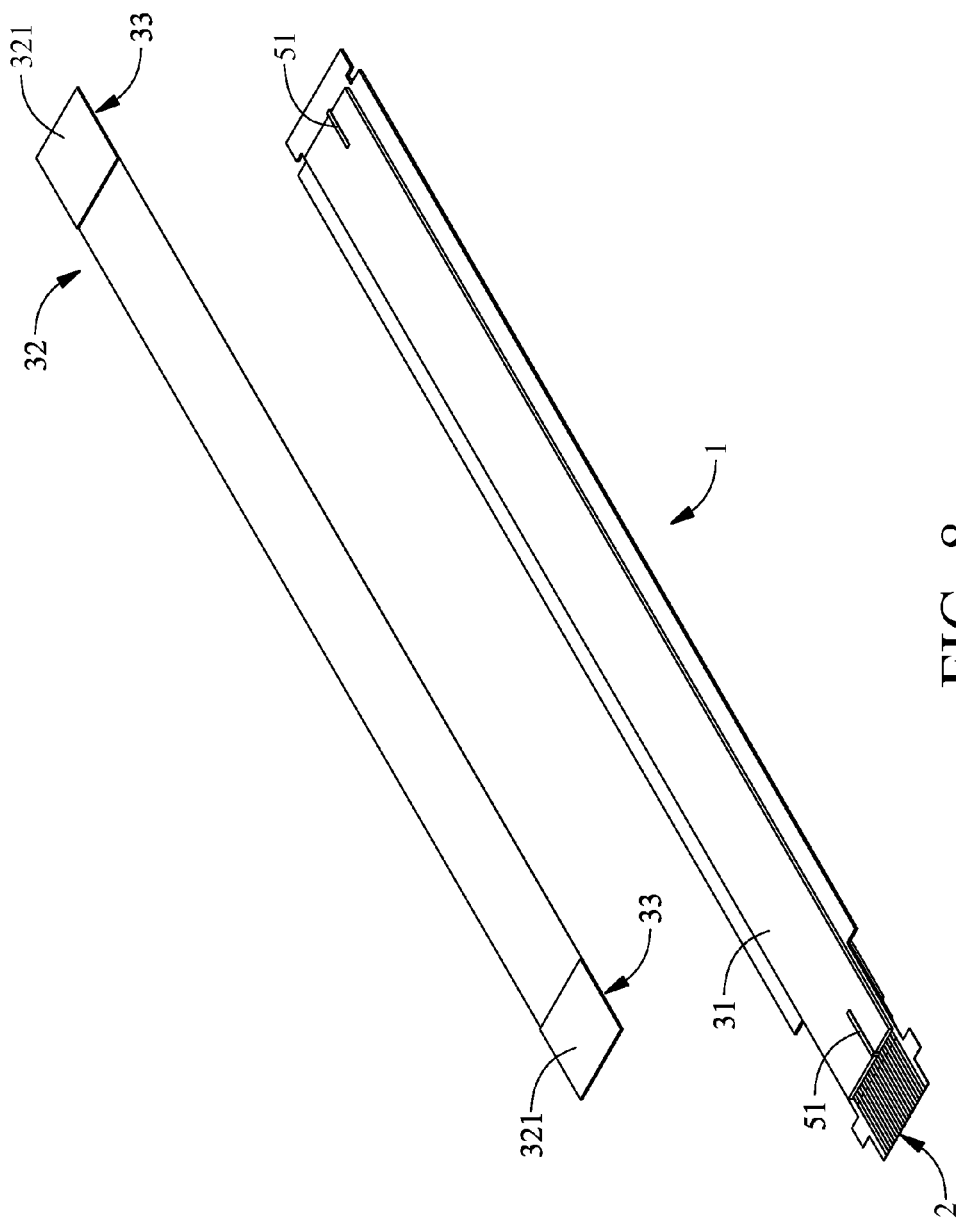
FIG. 8 is a schematic view of the third double sided adhesive layers adhered to the first aluminum foil layer shown in FIG. 7.
Figure 9:
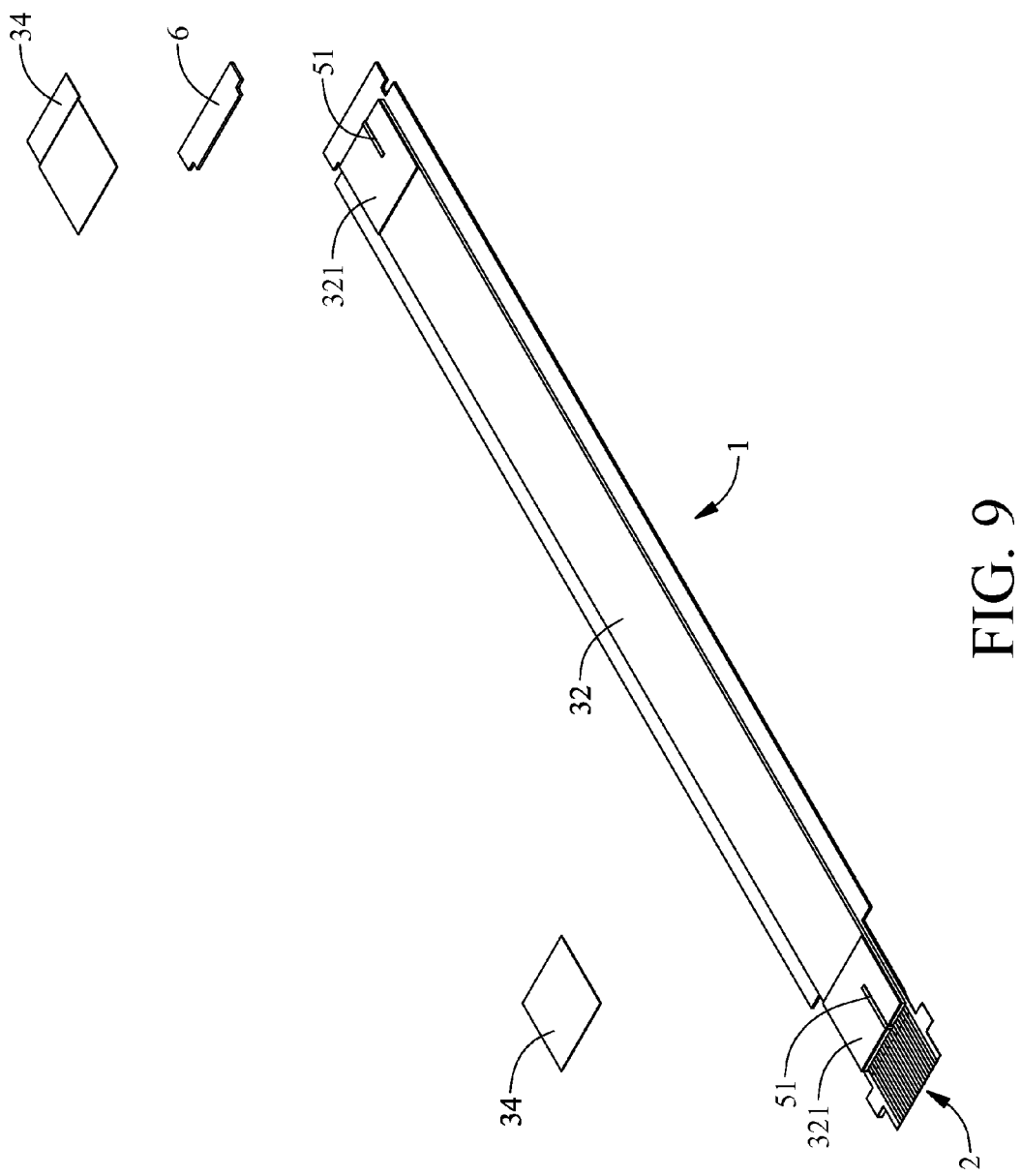
FIG. 9 is a schematic view of the first aluminum foil layer adhered to the first double sided adhesive layer, the third aluminum foil layers and a T-shaped reinforced plate according to the preferred embodiment of the present invention.
Figure 10:
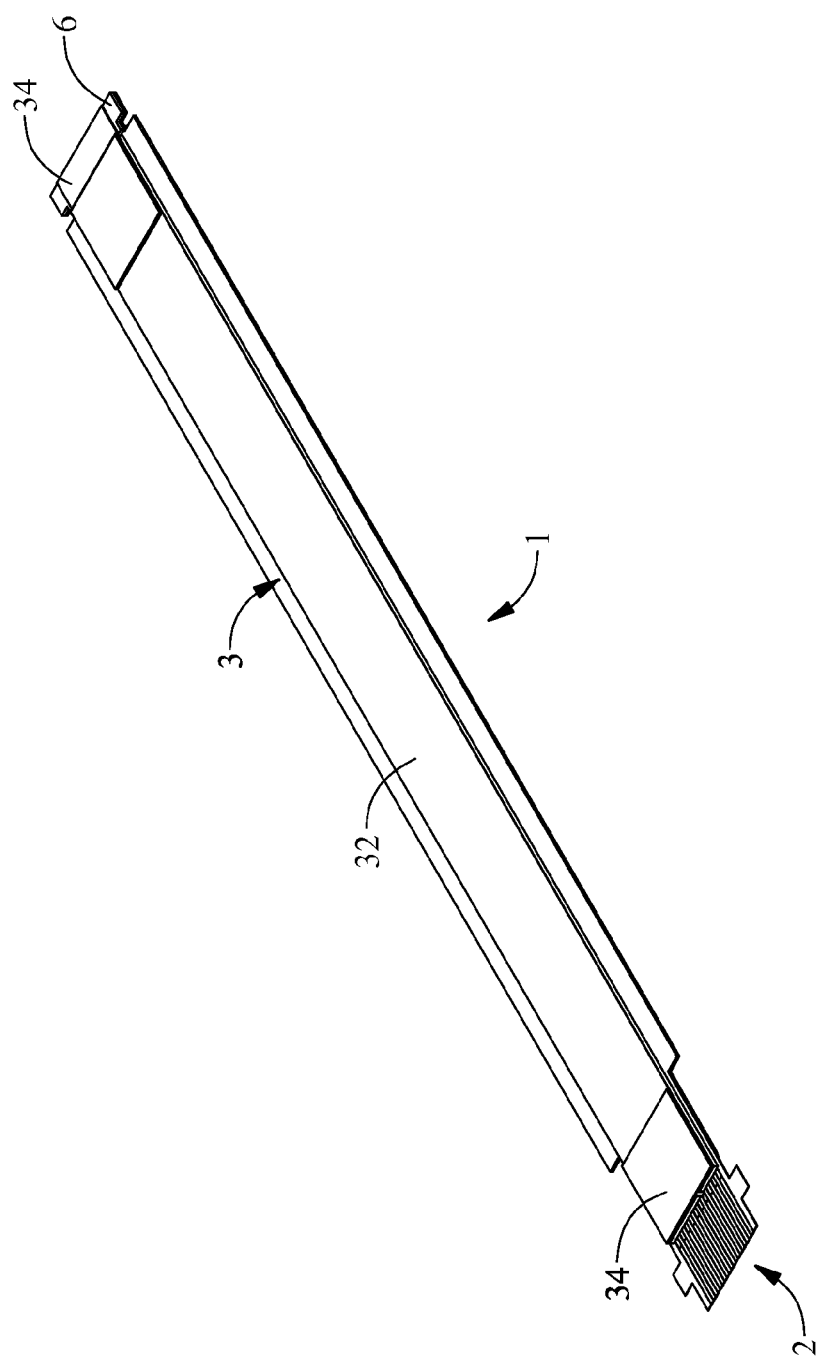
FIG. 10 is a schematic view of the third aluminum foil layers adhered to the first aluminum foil layer and the T-shaped reinforced plate connected to the cable body according to the preferred embodiment of the present invention.

Referring to FIG. 3 and FIG. 6, the SATA cable is characterized in that two ends of the at least a noise lead 5 each have a noise lead bend segment 51. Referring to FIG. 7 and FIG. 9, the first metal shield layer unit 3 comprises a first double sided adhesive layer 31, a first aluminum foil layer 32, two third double sided adhesive layers 33 and two third aluminum foil layers 34. The two ends of the first aluminum foil layer 32 each have a first aluminum foil layer bend segment 321. Referring to FIG. 6 and FIG. 7, the first double sided adhesive layer 31 is adhered to the top side of the cable body 1. Referring to FIG. 7 and FIG. 8, the third double sided adhesive layers 33 are adhered to two sides of the top surface of the first aluminum foil layer 32, respectively, and disposed between the first aluminum foil layer bend segments 321, and, afterward, the first aluminum foil layer bend segments 321 are bent and adhered to the top surface of the third double sided adhesive layers 33, respectively. Referring to FIG. 8 and FIG. 9, the first aluminum foil layer 32 is adhered to the top surface of the first double sided adhesive layer 31, and, afterward, the noise lead bend segments 51 are bent and electrically connected to the top surface of the first aluminum foil layer bend segments 321, respectively. Referring to FIG. 9 and FIG. 10, the third aluminum foil layers 34 are adhered to the top surfaces of the first aluminum foil layer bend segments 321, respectively, to thereby cover the noise lead bend segments 51. Hence, the SATA cable of the present invention is characterized in that the at least a noise lead 5 is electrically connected to the ground leads 24 and the first metal shield layer unit 3 so as to ground noise and thereby prevent noise from interfering with any external electronic component.

Figure 11:
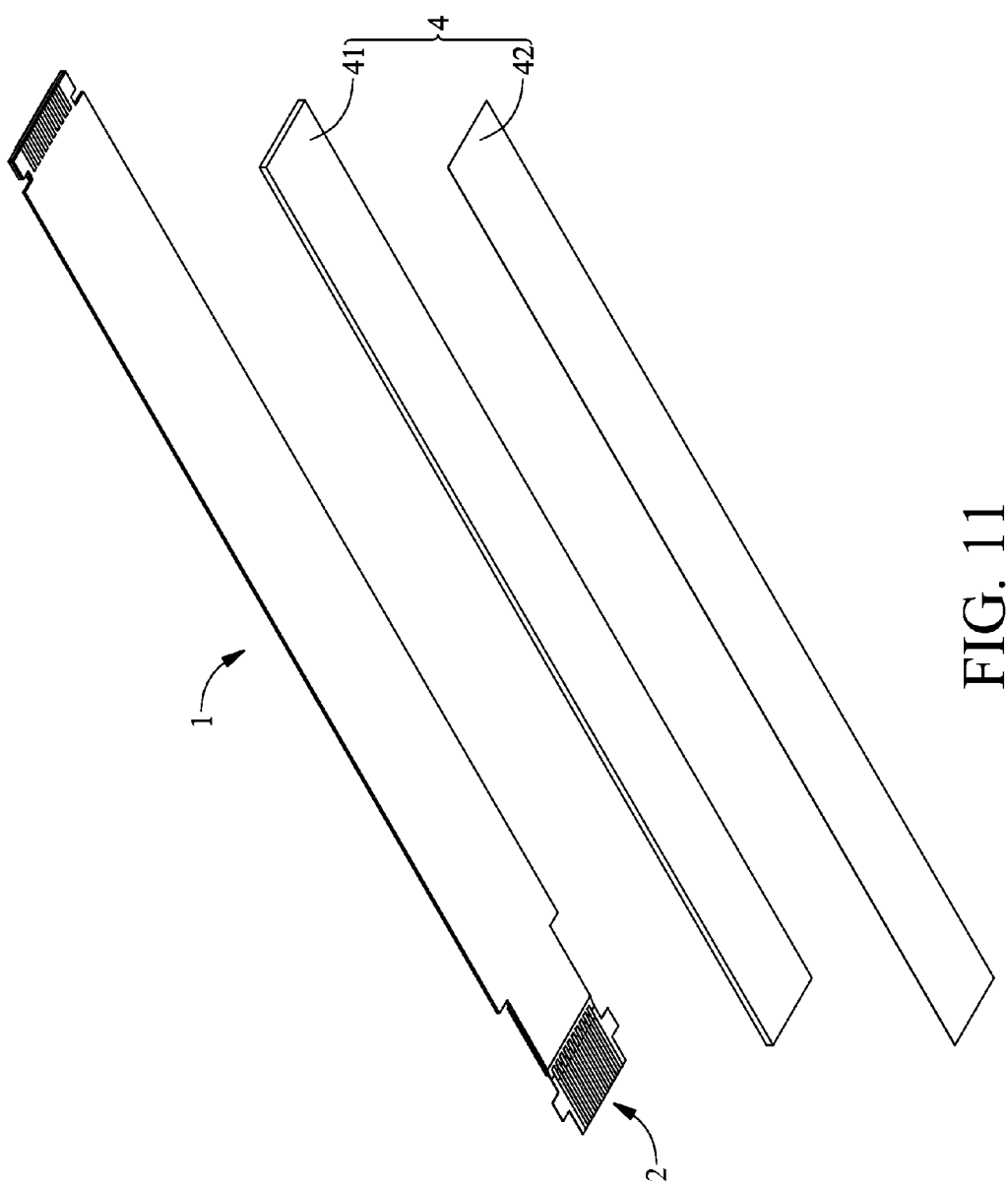
FIG. 11 is a schematic view of a second double sided adhesive layer and a second aluminum foil layer which have yet been adhered to the cable body according to the preferred embodiment of the present invention.
Figure 12:
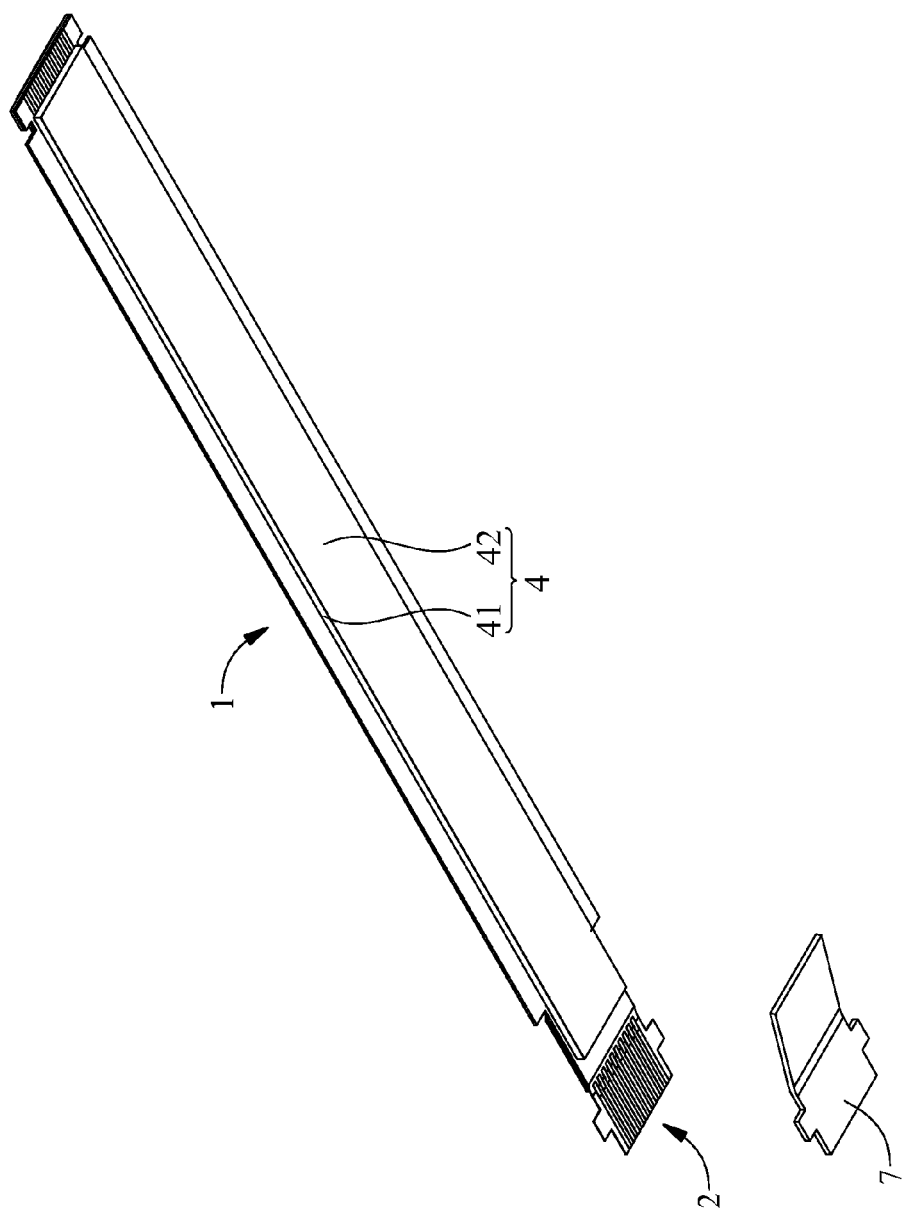
FIG. 12 is a schematic view of the second double sided adhesive layer and the second aluminum foil layer adhered to the cable body and a cruciform handheld plate according to the preferred embodiment of the present invention.
Figure 13:
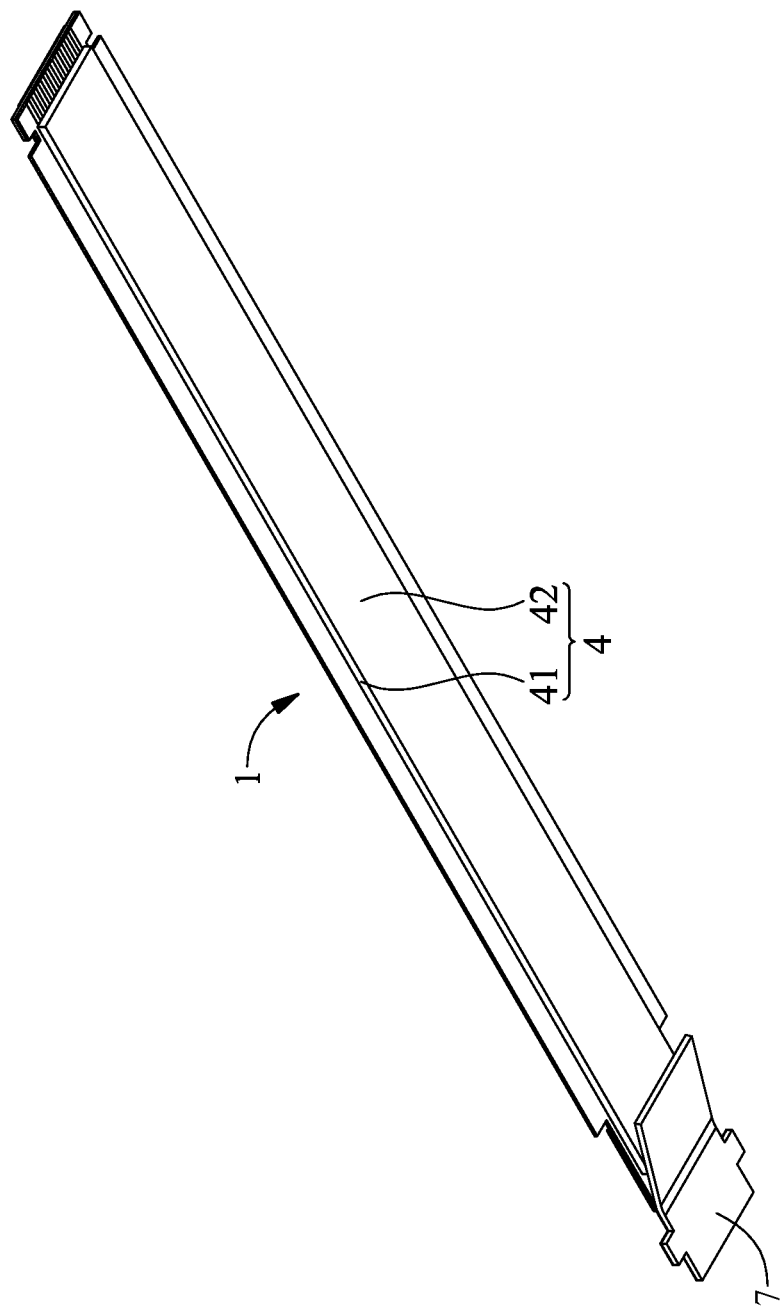
FIG. 13 is a schematic view of the cruciform handheld plate adhered to the cable body according to the preferred embodiment of the present invention.
Figure 14:
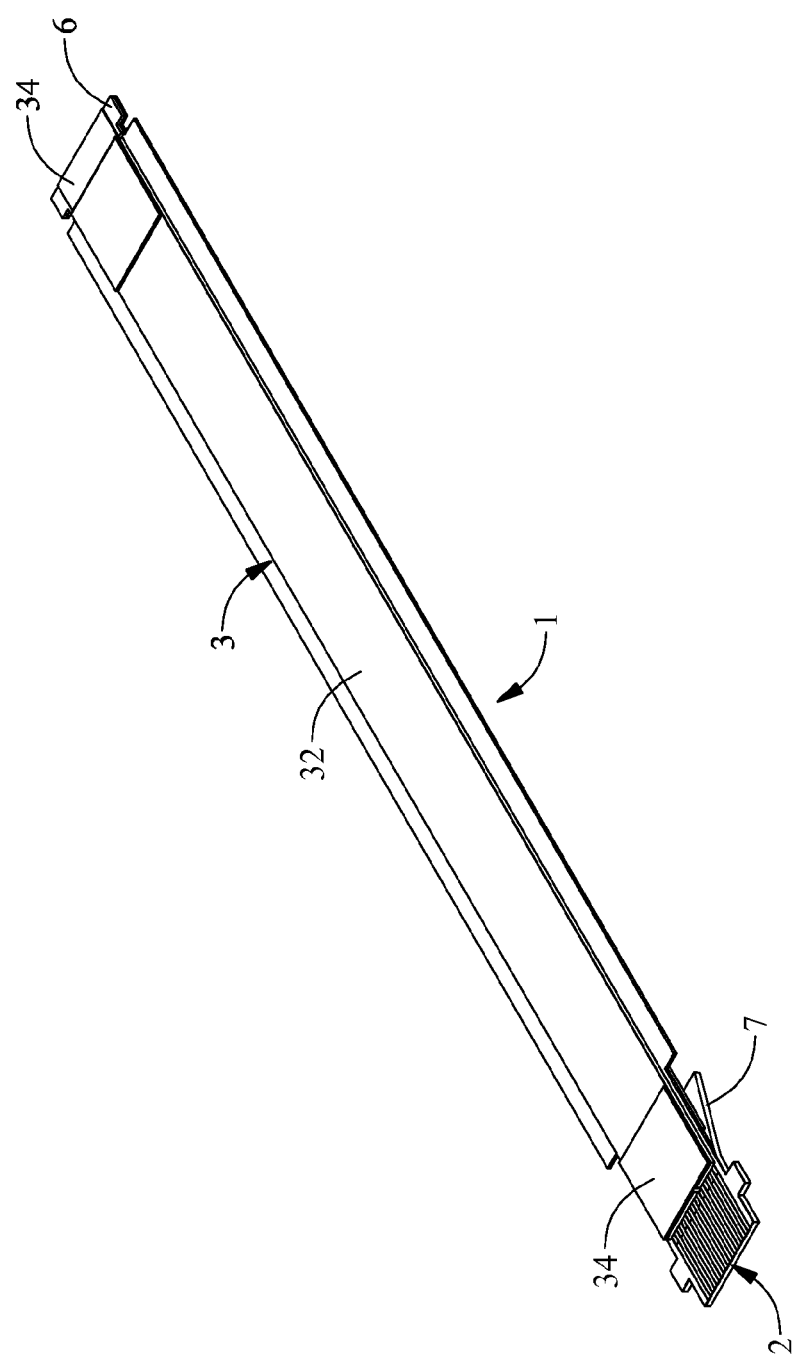
FIG. 14 is a schematic view of the SATA cable assembled according to the preferred embodiment of the present invention.

Referring to FIG. 11 and FIG. 12, the SATA cable is characterized in that the second metal shield layer unit 4 comprises a second double sided adhesive layer 41 and a second aluminum foil layer 42. The second double sided adhesive layer 41 is adhered to the bottom surface of the cable body 1. The second aluminum foil layer 42 is adhered to the bottom surface of the second double sided adhesive layer 41. Hence, the SATA cable of the present invention uses the second metal shield layer unit 4 to shield noise and thus prevent the noise from interfering with any external electronic component. In addition, the second double sided adhesive layer 41 is of a larger thickness than the first double sided adhesive layer 31 to further enhance noise shielding.

Referring to FIG. 11, the SATA cable is characterized in that the right end of the cable body 1 is T-shaped. Alternatively, the left end of the cable body 1 is cruciform. Alternatively, the right and left ends of the cable body 1 are T-shaped and cruciform, respectively. Hence, the SATA cable of the present invention can be firmly connected to an external electronic component or an electronic device.

Referring to FIG. 9, FIG. 10, and FIG. 12 through FIG. 14, the SATA cable further comprises a T-shaped reinforced plate 6, a cruciform handheld plate 7 or both. The T-shaped reinforced plate 6 is connected to the T-shaped right end of the cable body 1. The cruciform handheld plate 7 is connected to the cruciform left end of the cable body 1. Hence, the SATA cable of the present invention is advantageously characterized in that the T-shaped reinforced plate 6 reinforces the T-shaped right end of the cable body 1. Optionally, the SATA cable of the present invention can be easily connected to an external electronic component or an electronic device because of the cruciform handheld plate 7.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A SATA cable, comprising:
    a cable body;
    a lead group embedded in the cable body, having two ends exposed from two ends of the cable body, respectively, and comprising a signal transmitting lead group, a signal receiving lead group, a plurality of power leads and a plurality of ground leads, the signal transmitting lead group further comprising a first signal transmitting lead and a second signal transmitting lead, and the signal receiving lead group further comprising a first signal receiving lead and a second signal receiving lead;
    a first metal shield layer unit disposed on a surface of the cable body;
    a second metal shield layer unit disposed on another surface of the cable body; and
    at least a noise lead embedded in the cable body, electrically connected to at least one of the ground leads, and having two ends exposed from the cable body to thereby electrically connect with the first metal shield layer unit, wherein the two ends of the at least a noise lead each have a noise lead bend segment, wherein the first metal shield layer unit comprises a first double sided adhesive layer, a first aluminum foil layer, two third double sided adhesive layers and two third aluminum foil layers, with the first aluminum foil layer having two ends each having a first aluminum foil layer bend segment, with the first double sided adhesive layer adhered to a surface of the cable body, with the first aluminum foil layer adhered to the first double sided adhesive layer, with the third double sided adhesive layers adhered to two sides of the first aluminum foil layer, respectively, with the first aluminum foil layer bend segments adhered to the third double sided adhesive layers, respectively, with the noise lead bend segments electrically connected to the first aluminum foil layer bend segments, respectively, with the third aluminum foil layers adhered to the first aluminum foil layer bend segments and covering the noise lead bend segments, respectively.

2. The SATA cable of claim 1, wherein the at least a noise lead is disposed between the signal transmitting lead group and the signal receiving lead group.

3. The SATA cable of claim 1, where in the second metal shield layer unit comprises a second double sided adhesive layer and a second aluminum foil layer, with the second double sided adhesive layer adhered to another surface of the cable body, and with the second aluminum foil layer adhered to the second double sided adhesive layer.

4. The SATA cable of claim 1, where in the second metal shield layer unit comprises a second double sided adhesive layer and a second aluminum foil layer, with the second double sided adhesive layer adhered to another surface of the cable body, and with the second aluminum foil layer adhered to the second double sided adhesive layer, wherein the second double sided adhesive layer is of a larger thickness than the first double sided adhesive layer.

5. The SATA cable of claim 1, wherein one end of the cable body is T-shaped, another end of the cable body is cruciform, or the two ends of the cable body are T-shaped and cruciform, respectively.

6. The SATA cable of claim 5, further comprising at least one of a T-shaped reinforced plate and a cruciform handheld plate, with the T-shaped reinforced plate connected to the T-shaped end of the cable body, and with the cruciform handheld plate connected to the cruciform end of the cable body.

* * * * *